United States Patent [19]

Betsch et al.

[11] Patent Number: 4,551,394
[45] Date of Patent: Nov. 5, 1985

[54] INTEGRATED THREE-DIMENSIONAL LOCALIZED EPITAXIAL GROWTH OF SI WITH LOCALIZED OVERGROWTH OF GAAS

[75] Inventors: Regis J. Betsch, Eden Prairie; Michael S. Liu, Bloomington; Obert N. Tufte, Prior Lake, all of Minn.

[73] Assignee: Honeywell Inc., Minneapolis, Minn.

[21] Appl. No.: 674,903

[22] Filed: Nov. 26, 1984

[51] Int. Cl.$^4$ .......................................... H01L 21/205
[52] U.S. Cl. ........................... 428/641; 148/DIG. 26; 148/DIG. 59; 148/DIG. 72; 148/175; 148/33.4; 428/642; 357/16; 357/17
[58] Field of Search ............................... 428/641–642; 148/DIG. 26, DIG. 59, DIG. 72, 175, 33.4; 357/16, 17

[56] References Cited

U.S. PATENT DOCUMENTS

| | | | |
|---|---|---|---|
| 3,366,517 | 1/1968 | Yu | 148/175 |
| 3,433,684 | 3/1969 | Zanowick | 148/33.4 |
| 3,534,234 | 10/1970 | Clevenger | 317/235 |
| 3,574,008 | 4/1971 | Rice | 148/175 |
| 3,586,925 | 6/1971 | Collard | 317/234 |
| 3,935,040 | 1/1976 | Mason | 148/175 |
| 3,984,857 | 10/1976 | Mason | 148/175 |
| 4,000,020 | 12/1976 | Gartman | 148/175 |
| 4,116,751 | 9/1978 | Zaromb | 148/175 |
| 4,507,158 | 3/1985 | Kamins et al. | 147/175 |

OTHER PUBLICATIONS

V. J. Silvestri et al., J. Electrochem. Soc., Solid-State Science and Technology, Feb. 1972, pp. 245–250.
P. Rai-Choud Hury et al., J. Electrochem. Soc., Solid-State Science, Jan. 1971, pp. 107–110.
Ferenc E. Rosztoczy et al., J. Electrochem. Soc., vol. 119, No. 8, Aug. 1972, pp. 1119–1121.
Voss et al., "Device Isolation Technology by Selective Low-Pressure Silicon Epitaxy", 1983, IEDM, pp. 35–38.
Jastrzebsk et al., "Growth Process of Silicon Over SiO$_2$ by CVD: Epitaxial Lateral Overgrowth Technique", J. Electrochem. Soc., Solid-State Science & Technology, vol. 130, No. 7, Jul. 83, pp. 1571–1580.
Cohen, "Optical IC's Unite GaAs LED, Silicon Switches", Electronics, Dec. 15, 1983, pp. 85–86.
Fletcher et al., "GaAs Light Emitting Diodes Fabricated on Ge Coated Si Substrates", App. Phys. Letters 44(10), May 15, 1984, pp. 967–969.

Primary Examiner—Veronica O'Keefe
Attorney, Agent, or Firm—Omund R. Dahle

[57] ABSTRACT

Localized epitaxial growth of GaAs from a silicon monocrystalline substrate to provide a three-dimensional Si-GaAs structure and method. The silicon has an insulating layer deposited thereover and a window is opened through the layer to expose a small area of the underlying silicon from which silicon is epitaxially grown until the window is nearly full whereupon a thin buffer layer such as germanium is epitaxially grown over the epi-silicon to fill the window. $Al_xGa_{1-x}As$ (where $x \geq 0$) is then locally epitaxially grown from the buffer layer and it grows laterally as well as vertically to cover the surrounding insulating layer surface and provide a site for high frequency electronics.

5 Claims, 6 Drawing Figures

INTEGRATED THREE-DIMENSIONAL LOCALIZED EPITAXIAL GROWTH OF SI WITH LOCALIZED OVERGROWTH OF GAAS

BACKGROUND AND SUMMARY OF THE INVENTION

The present invention is directed to the technology of high-density high-speed three-dimensional integrated circuits structures of silicon and gallium arsenide by localized epitaxial growth (LEG). Silicon dominates the high density circuits in LSI (large scale integration) and VLSI (very large scale integration) and gallium arsenide dominates the high speed circuit beyond 1 GHz. Also aluminum gallium arsenide can be combined with gallium arsenide to make electronic and optoelectronic gates with very high speed, low power and excellent noise immunity. The present invention shows apparatus and process for using all three in 3-D LEG, in which high quality single crystal GaAs is seeded by LEG silicon and epitaxially grown over an insulating barrier.

In the art it is known to grow epitaxial silicon inside the window of an insulator region such as is shown in Voss et al, "Device Isolation Technology by Selective Lowo-Pressure Silicon Epitaxy", 1983, IEDM, p35–38. An epitaxial lateral overgrowth of silicon over $SiO_2$ is described by Jastrzebski et al, "Growth Process of Silicon over $SiO_2$ by CVD:Epitaxial Lateral Overgrowth Technique", J. Electrochem. Soc., Solid-State Science & Technology, Vol.130, No.7, July 83, p1571–80. Yoshiro Ohmachi of NTT as reported the growth of GaAs on silicon by the use of a recrystallized germanium interface layer in Electronics, Dec. 15, 1983, p.85. This technique is unacceptable for the fabrication of lasers because of the high dislocation density which is inherent in a recrystallization technique. Inability to fabricate lasers makes it impossible to use the technique for high speed optical devices since LED's cannot be operated at the desired frequencies. The use of epitaxial germanium between silicon and gallium arsenide in large area silicon substrates is shown by Fletcher et al, "GaAs Light Emitting Diodes Fabricated on Ge-coated Si Substrates", App.Phy.Letters, 44(10), May 15, 1984, p967–69. The growth in a well described in this paper makes no mention of growing single crystal GaAs over the $SiO_2$. Overgrowth of GaAs on the $SiO_2$ allows the formation of GaAs devices which can be electrically isolated from the silicon substrate. This is particularly important for high speed GaAs electronics.

The present invention is directed to localized epitaxial structures of silicon, germanium and gallium arsenide (i.e. $Al_xGa_{1-x}As$, where $x \geq 0$) grown up through the window of an insulator layer such as $SiO_2$ and then localized lateral epitaxial overgrowth of the GaAs over the surface of the surrounding $SiO_2$, so that devices can be fabricated in the GaAs, or the GaAs can be used as a substrate for example AlGaAs/GaAs electronic and optoelectronic devices. The devices could be used for intra or inter chip communication involving GaAs MUX/DEMUX modules.

DESCRIPTION

Figure 1:
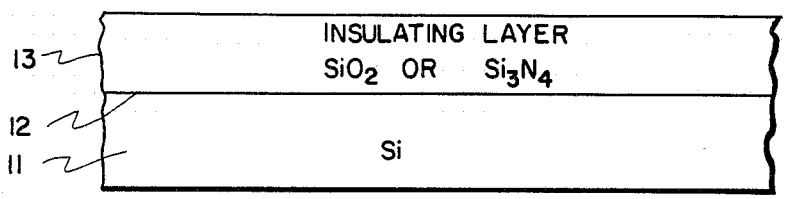
FIGS. 1–3b show progressive steps in the fabrication of the three-dimensional integrated circuit structure according to the invention.

The high-density, high speed three-dimensional integrated circuit structure of silicon and gallium arsenide begins with a monocrystal silicon substrate 11 as shown in FIG. 1. The Si substrate 11 may contain in its surface 12 electronic integrated circuits prepared by conventional semiconductor technology. Deposited over the planar surface 12 of substrate 11 is an insulating layer 13 such as silicon dioxide ($SiO_2$) or silicon nitride ($Si_3N_4$). The insulating layer may be on the order or, for example, a micron thick.

Figure 2:
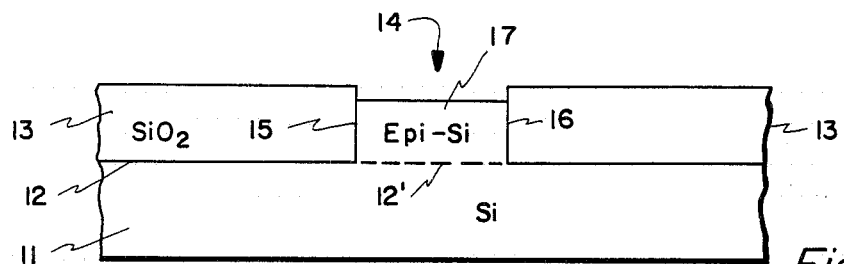

In the next step as shown in FIG. 2, a window 14 is opened through the insulating layer 13 to expose the silicon surface 12 at area 12', the window through the $SiO_2$ being defined by walls 15 and 16. Such a window may be on the order of about 1–2 microns square or larger. Then upward epitaxial growth of silicon from surface 12' within the window area proceeds until the growth thickness fills the window in the $SiO_2$ nearly to the surface thereof as is shown at 17. This epitaxial growth continues the monocrystal structure of substrate 11.

Figure 3:
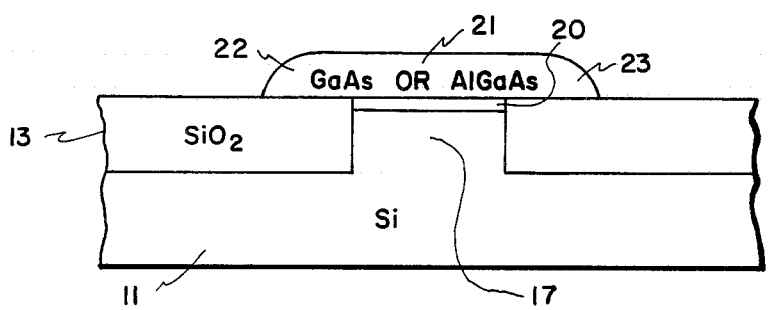

An epitaxial monocrystalline thin-film buffer layer 20 of germanium or any other material having suitable lattaice constants and thermal expansion coefficients, FIG. 3, is next grown in the window area over the surface of the epi-silicon 17 to provide better thermal and lattice matching for gallium arsenide than does the silicon. The epitaxially grown buffer layer, which in one embodiment is germanium, and which may typically be on the order of 2000 Å thick, has only a slight crystal lattice mismatch with either silicon or with GaAs, and thus is a good monocrystal buffer layer matching the underlying silicon monocrystal lattice to the gallium arsenide.

Figure 4A:
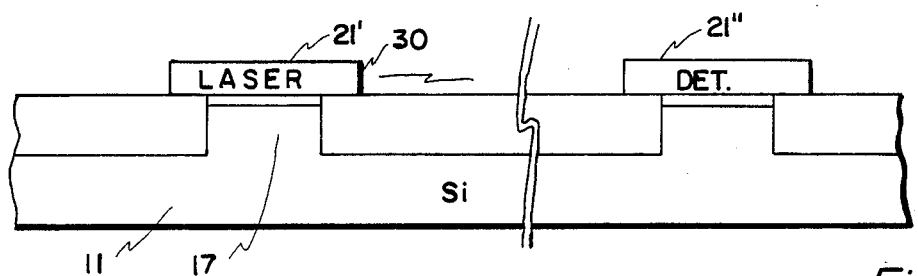
FIG. 4a shows a plurality of the structures and FIG. 4b shows electrically isolated GaAs circuits on the structure.
Figure 3B:
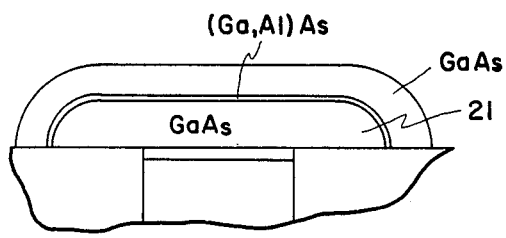
Figure 4B:
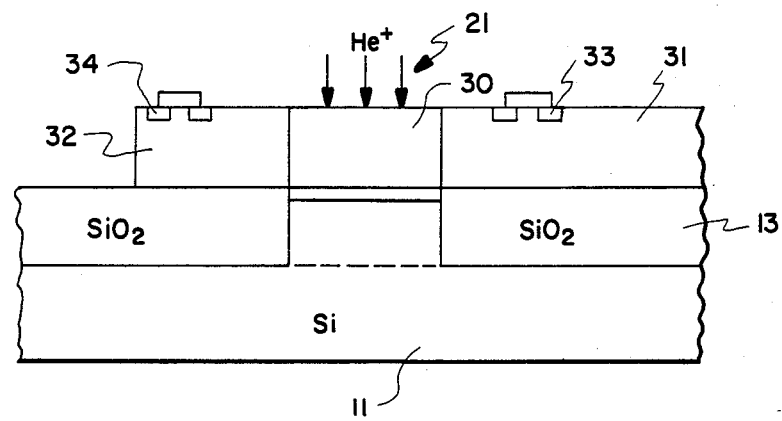

A layer 21 of $Al_xGa_{1-x}As$, where $x \geq 0$, is then epitaxially grown such that it covers the buffer layer and extends in a lateral direction onto the top surface of the surrounding insulating layer. If the epitaxial silicon 17 and epitaxial buffer layer 20 described above have filled the window so the surface of the buffer layer is approximately of even level with the surface of the $SiO_2$, then the epitaxial gallium arsenide 21 grown on the buffer layer immediately grows laterally as well as vertically and overgrows an area of the $SiO_2$ surrounding the window. This lateral overgrowth of the GaAs 21 is shown as 22 and 23 and is typically on the order of 4000 Å to several microns thick. Devices can then be formed in the single GaAs layer using conventional photolithography, and ion implantation; or additional AlGaAs/GaAs layers of varying composition, doping, and thickness can be deposited to be used for the fabrication of complex multilayer devices. This three-dimensional GaAs structure can be used as an electronic device or circuit, such as a high speed transistor or multiplexer or as an electrooptical device such as a laser. In FIG. 4(a) two such GaAs structures 21' and 21" as described in FIGS. 1–3 are shown in which a laser has been formed in device 21' and has an etched emitting face 30 in which light is directed towards a detector 21". In FIG. 4(b), the overgrown GaAs material 21 is utilized for electrically isolated high speed GaAs circuits 23 and 24 which could, for example, be used in conjunction with the laser in FIG. 4(a) for high speed chip/chip communications. In this figure the GaAs layer 21 has an isolating section 30 formed by proton (He+) bombardment to isolate sections 31 and 32 from one another. Alternatively etching of the GaAs at the area 30 may be used to isolate the several areas. Electronic circuits 33 and 34 are shown schematically in areas 31 and 32, respectively.

The embodiments of the invention in which an exclusive property or right is claimed are defined as follows:

1. A Si-GaAs integrated electronic structure by localized epitaxial growth comprising:

a monocrystalline silicon substrate having a planar surface coated with an insulating layer;

said insulating layer having a window down through the layer to the silicon surface thereby exposing a portion of the silicon surface;

an epitaxially-grown monocrystalline silicon island grown from said surface portion and filling said window substantially to the upper surface of the insulating layer;

an epitaxially-grown monocrystalline thin-film buffer layer grown from and over the surface of said silicon island;

an epitaxially-grown monocrystalline layer of $Al_xGa_{1-x}As$ (where $x \geq 0$) grown from said buffer layer which layer of $Al_xGa_{1-x}As$ extends horizontally from the island over the surface of the insulating layer adjacent said window.

2. The structure according to claim 1 wherein said insulating layer is on the order of one micron thick.

3. The structure according to claim 1 wherein the window through the insulating layer has dimensions in the range of 1 to 2 microns.

4. The structure according to claim 1 wherein the buffer layer is on the order of 2000 Å thick.

5. The structure according to claim 1 in which said epitaxially grown monocrystalline thin film buffer layer is germanium.

* * * * *